(12) United States Patent
Buffle et al.

(10) Patent No.: US 12,402,333 B2
(45) Date of Patent: Aug. 26, 2025

(54) ELECTRONIC COMPONENT COMPRISING A 3D CAPACITIVE STRUCTURE

(71) Applicant: Murata Manufacturing Co., Ltd., Nagaokakyo (JP)

(72) Inventors: Larry Buffle, Grenoble (FR); Frédéric Voiron, Barraux (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 455 days.

(21) Appl. No.: 18/087,579

(22) Filed: Dec. 22, 2022

(65) Prior Publication Data
US 2023/0134193 A1    May 4, 2023

Related U.S. Application Data

(63) Continuation of application No. PCT/IB2021/055541, filed on Jun. 23, 2021.

(30) Foreign Application Priority Data

Jun. 24, 2020 (EP) ..................................... 20305692

(51) Int. Cl.
| | |
|---|---|
| *H10D 1/66* | (2025.01) |
| *H10D 1/00* | (2025.01) |
| *H10D 64/01* | (2025.01) |

(52) U.S. Cl.
CPC ............. *H10D 1/665* (2025.01); *H10D 1/047* (2025.01); *H10D 64/01* (2025.01)

(58) Field of Classification Search
CPC ...... H01L 23/481; H10D 1/047; H10D 1/665; H10D 1/716; H10D 64/01

(Continued)

(56) References Cited

U.S. PATENT DOCUMENTS

| | | |
|---|---|---|
| 2011/0037144 A1 | 2/2011 | Chen et al. |
| 2012/0080772 A1 | 4/2012 | Asami et al. |

(Continued)

FOREIGN PATENT DOCUMENTS

| | | |
|---|---|---|
| EP | 3588560 A1 | 1/2020 |

OTHER PUBLICATIONS

Gruenler et al.; "High-Voltage Monolithic 3D Capacitors based on Through-Silicon-Via Technology"; IEEE International Interconnect Technology Conference and IEEE Materials for Advanced Metallization Conference, May 18-21, 2015, Grenoble, France.

(Continued)

*Primary Examiner* — Hoai V Pham
(74) *Attorney, Agent, or Firm* — ArentFox Schiff LLP

(57) ABSTRACT

An electronic component comprising a 3D capacitive structure includes a substrate having a contoured surface comprising a plurality of wells extending from the surface into the substrate body, a dielectric formed over, and conforming to the shape of, the contoured surface, and a first electrode formed over the dielectric and conforming to the contoured surface shape. The substrate constitutes a second electrode and the dielectric is interposed between it and the first electrode. Portions of the dielectric are exposed through openings at the base of the contoured surface and contact an insulating layer formed under the substrate, reducing the electrostatic field arising in the contacted portions of the dielectric when a potential difference is applied between the first and second electrodes. The openings at the bottom of the wells are obturated by the dielectric, defining blind holes within the wells, and the first electrode is in the blind holes.

13 Claims, 9 Drawing Sheets

(58) Field of Classification Search
USPC .......................................................... 257/68
See application file for complete search history.

(56) References Cited

U.S. PATENT DOCUMENTS

| | | |
|---|---|---|
| 2016/0020267 A1* | 1/2016 | Lin ........................ H10D 1/042 |
| | | 257/532 |
| 2016/0087030 A1 | 3/2016 | Robutel |
| 2017/0170131 A1 | 6/2017 | Roozeboom et al. |
| 2020/0052064 A1 | 2/2020 | Lu et al. |

OTHER PUBLICATIONS

International Search Report issued for PCT/IB2021/055541, date of mailing Sep. 27, 2021.

* cited by examiner

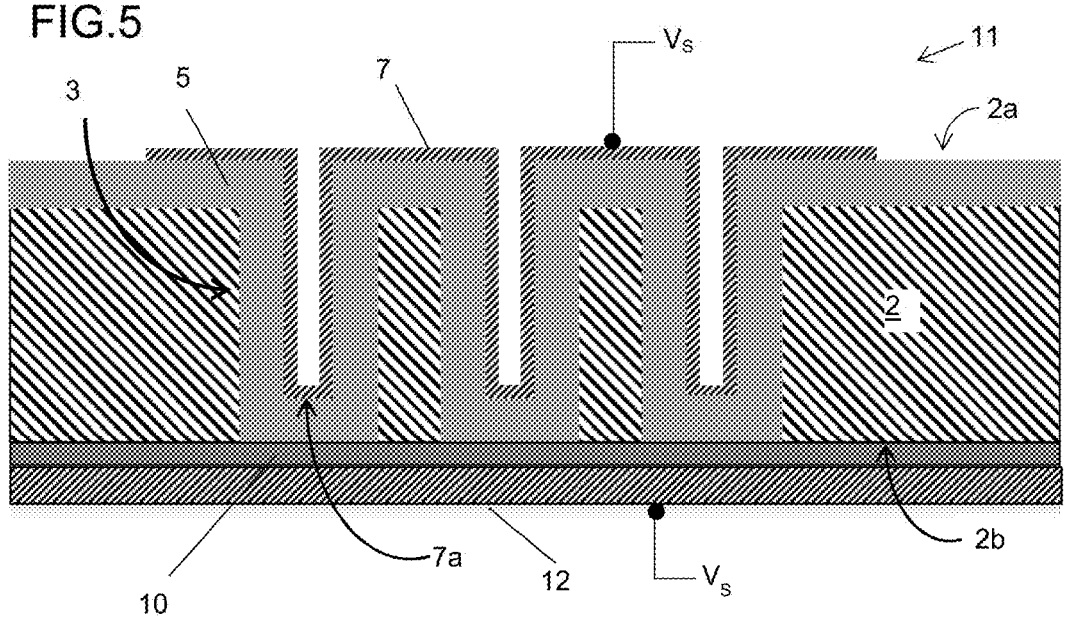
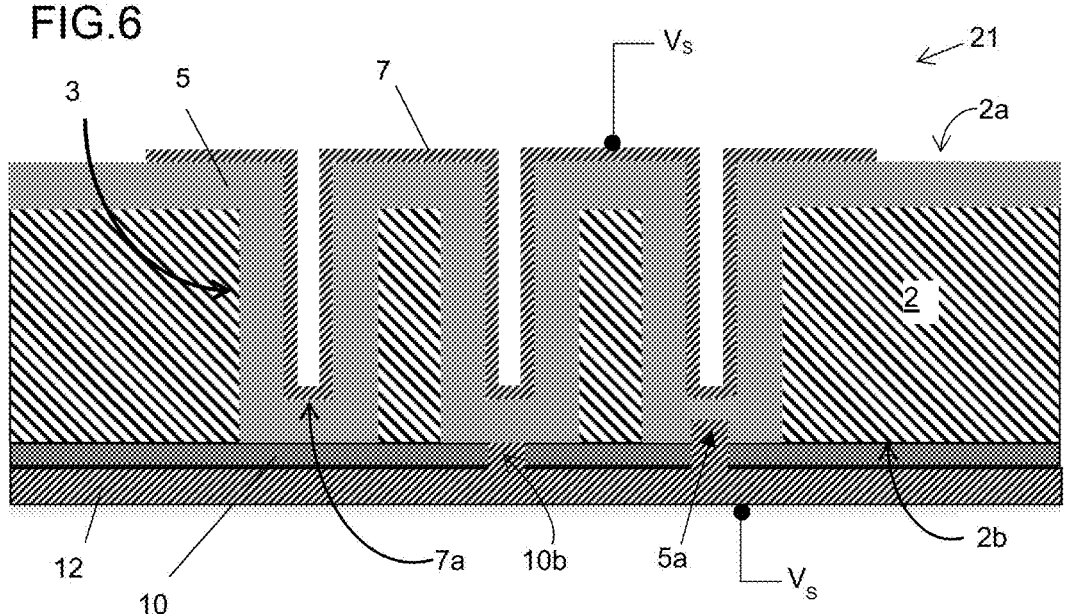

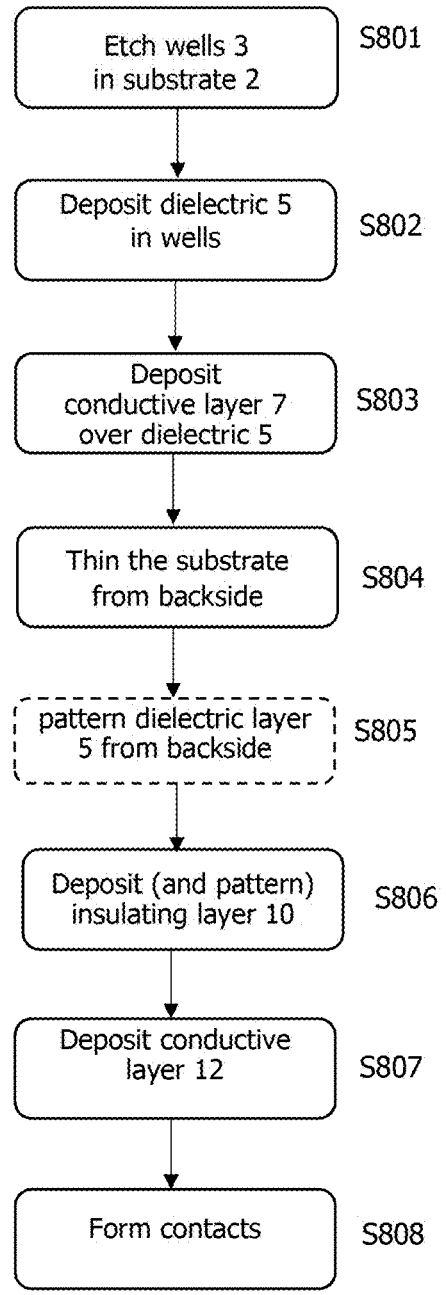

… … …

ELECTRONIC COMPONENT COMPRISING A 3D CAPACITIVE STRUCTURE

CROSS REFERENCE TO RELATED APPLICATIONS

The present application is a continuation of International application No. PCT/IB2021/055541, filed Jun. 23, 2021, which claims priority to European Patent Application No. 20305692.4, filed Jun. 24, 2020, the entire contents of each of which are incorporated herein by reference.

FIELD OF THE INVENTION

The present invention relates to the field of electronic components comprising three-dimensional (3D) capacitive structures and, more particularly, to such components designed for use in high-voltage applications.

TECHNICAL BACKGROUND

Increasing capacitance density is a key objective in the development of emerging capacitive components. In the case of silicon-integrated capacitors, one approach to boost capacitance density includes increasing the specific surface of the capacitive structure by 3D-structuring the surface of the silicon wafer. The 3D-structuring may consist in forming a set of wells in the wafer and deposition of a stack of electrode and dielectric layers conformally over the surface of the set of wells. The 3D-structuring may consist in forming a set of columns or pillars protruding from the wafer, and deposition of a stack of electrode and dielectric layers conformally over the surface of the set of columns/pillars. These techniques allow a reduction of die surface and bring silicon-integrated capacitive technology to a level of integration that matches implementation requirements of low-voltage applications.

However, in the emerging field of high voltage applications (steered by the roadmap of integrated power technology like GaN (gallium nitride) and SiC (silicon carbide)), capacitive technology integration remains little studied. In such applications, to prevent early fails and/or premature wearing out of the capacitive device, the operating electric field must be guaranteed with a sufficient margin for the desired lifetime of the device. One way to sustain the operating electrical field is by increasing the thickness of the dielectric layer. However, existing silicon processing technology for high voltage or power applications (e.g., greater than 500 Volts) is incompatible with large dielectric thickness.

For example, Gruenler et al. ("High-voltage monolithic 3D capacitors based on through-silicon-via technology, IEEE International Interconnect Technology Conference and IEEE Materials for Advanced Metallization Conference, 18-21 May 2015, Grenoble) proposes a 3D capacitor for high-voltage applications. An example 100 of Gruenler's capacitor is shown in FIG. 1. As shown, the capacitor 100 includes a substrate 102 having etched therein an array of cylindrical capillaries. The cylindrical capillaries are filled with a capacitive structure consisting of a semiconductor layer 104, a dielectric layer 106, a polysilicon layer 108, and a metal layer 110. The semiconductor layer 104 and the metal layer 110 provide a bottom electrode and a top electrode respectively for the capacitive structure.

Gruenler's 3D capacitor structure however is not well-suited for utilizing a large dielectric thickness. In one aspect, the 3D structure suffers from a high level of mechanical stress once the cylindrical capillaries are filled by the capacitive structure. The high mechanical stress leads to substantial wafer warpage, complicating even further subsequent process steps. A thicker dielectric would exacerbate this deficiency of Gruenler's structure, rendering capacitive integration even more complex. Moreover, it would significantly increase the probability of defects created or occurring in the dielectric coating (e.g., dielectric cracking or delamination), leading to random device breakdown.

Furthermore, in high voltage applications a problem arises in structures such as Gruenler's due to the concentration of electrostatic charge. The Applicant's co-pending application EP 18 305 789.2 describes a 3D capacitor structure on which a stack of electrode and dielectric layers is formed over a set of pillars protruding from a substrate surface, and the pillars have rounded-off corners so as to reduce concentration of electrostatic charge. The rounding of the corner of the protruding wall structure results in a more uniform distribution of electrostatic field at the corner when an electrical device, such as a capacitor for example, is formed in the wall structure. This reduces electrical stress within the structure and enables it to better withstand the operating electrical field of high-voltage applications. Improved performance—in terms of breakdown voltage, leakage, product reliability and yield—follows as a result. The rounding of the corner also reduces mechanical stress within the structure when a dielectric layer is used to coat the structure. Generally, high mechanical stress occurs in the dielectric layer when it is laid over a sharp edge or corner. Rounding the corner reduces this mechanical stress. Moreover, rounding the corner leads to a more uniform dielectric layer in terms of thickness (i.e., less voiding), which is beneficial to dielectric layer performance enhancement.

To illustrate the relationship between electrical stress within a structure and the structure's geometry, FIG. 2 shows the distribution of the electrostatic field magnitude inside a silicon dioxide dielectric for different example electrode geometries 202, 204, 206, and 208, as calculated in simulations. The simulations consider the case where a $SiO_2$ dielectric layer 1.3 μm thick is sandwiched by opposite top and bottom electrodes (not shown in FIG. 2) and a potential difference of 1000V is applied between the electrodes. In FIG. 2, curves 210 and 216 illustrate the theoretical maximum field intensity that $SiO_2$ can withstand. Certain of these geometries may arise in the vicinity of the bottom of wells in a 3D-contoured capacitive structure such as that of Gruenler, and others may arise at the bases of pillars protruding from the substrate in a 3D-contoured capacitive structure such as that of EP 18 305 789.2.

The electrostatic field magnitude at a given point of the electrode geometry is directly related to the local difference of charge density between the opposite electrodes. As such, where the electrode geometry is uniform, such as electrode geometry 202, the electrostatic field is evenly distributed across the electrode geometry and the electrostatic field magnitude thus remains constant over the entirety of the electrode geometry.

However, when the electrode geometry contains a singular point, e.g., a sharp corner as in electrode geometry 204, the difference of length/surface between the opposite electrodes at the singular point induces a difference of charged density near the singular point. For example, in electrode geometry 204, the inner contour of the sharp corner has a smaller length/surface than the outer contour of the corner. Respecting the principle of overall electrostatic neutrality (i.e., that the integral of charges on the top electrode is equal to the integral of charges on the bottom electrode), a higher charge density (in Coulombs/unit of area) arises at the corner of the bottom electrode (i.e., the inner electrode protruding into the dielectric) compared to that on the corner of the top electrode (i.e., the outer electrode overlying the dielectric). As a consequence, at the sharp corner, the electrostatic field exhibits a peak in magnitude as shown by the curve 212. In practical terms, the peaking electrostatic field magnitude reflects the presence of very high electrostatic fields that may exceed the dielectric strength and thus lead to faster dielectric wear out and/or earlier breakdown.

Local concentrations of electrostatic field in the structure can be reduced by smoothing or rounding singular points (e.g., corners, peaks, etc.) in the geometry, as is done in the structures proposed in EP 18 305 789.2. The effect of this smoothing or rounding is illustrated by example electrode geometries 206 and 208. As shown by the curve 214, the rounded electrode geometry 208 exhibits a smooth distribution of electrostatic field magnitude. Though the electrostatic field magnitude is not constant across the geometry, it does not exhibit a peak as in the case of electrode geometry 204, for example. Further increase of the curvature radius, as in electrode geometry 208, ensures greater matching between the top and bottom electrode surfaces.

In order to prevent early component breakdown due to high electrostatic fields, it is preferable for the curvature radius of the rounded corner to be configured to be greater than the thickness of the dielectric layer and, more preferably, for the curvature radius of the rounded corner to be equal to or greater than twice the thickness of the dielectric layer. However, in practice, it can be difficult to achieve the desired value for the radius of curvature. This problem may be better understood from a consideration OF FIG. 3A and FIG. 3B.

FIG. 3A is a scanning electron microscopy (SEM) image of a group of neighboring pillars in a 3D-capacitor structure described in EP 18 305 789.2. FIG. 3B is a schematic representation of a portion of the dielectric between the bases of two neighboring pillars in the structure of FIG. 3A.

FIG. 3B shows how electrostatic field intensity varies in the dielectric. More particularly, the intensity of the electrostatic field is highest in the portion shown in dark grey/black towards the inside of the bend in the dielectric. The field intensity is still relatively high in the grey regions shown filling the majority of the "legs" of the dielectric, reducing in the light regions towards the bottom of the diagram, and lowest at the bottom left and bottom right of the diagram.

In the example represented in FIGS. 3A and 3B the capacitive structure comprises a dielectric which is a laminated stack of alternating dielectric layers designed to be subjected to 1200V during use. Typically, the dielectric is deposited by low pressure chemical vapor deposition (LPCVD) processes and, because of LPCVD conformalities (which are typically between 50% and 90% when depositing layers onto a contoured surface), the thickness of the dielectric is lower at the base of the pillars than it is over the tops of the pillars, and the profile is more aggressively rounded at the base of the pillars. Thus, for example, at the bases of the pillars the thickness of the dielectric may be only 1.5 µm whereas the radius of curvature of the dielectric may be 1 µm. This is far from the advantageous case where the radius of curvature is 2 or more times the thickness of the dielectric. The value of electrostatic field intensity in this region is high, and can be greater than 15 MV/cm.

A corresponding problem arises in the case of capacitive stacks formed in wells/pores in a substrate, where excessive values of electrostatic field strength may arise in the dielectric in the vicinity of the bottoms of the wells.

The present invention has been made in the light of the above issues.

SUMMARY OF THE INVENTION

Embodiments of the present invention provide new techniques which aim at reducing electrostatic field concentration in dielectric layers in 3D capacitive structures, notably in the region at the bottom of wells formed in the substrate.

The present invention provides an electronic component comprising a capacitive structure, the component comprising:

a substrate having a contoured surface comprising a plurality of wells extending into the substrate from the substrate surface;

a dielectric formed over the contoured surface of the substrate and conforming to the shape of the contoured surface, portions of the dielectric being exposed through openings at the bottom of the wells in the contoured surface of the substrate;

a first electrode of the capacitive structure, said first electrode being formed over the dielectric and conforming to the shape of the contoured surface, the dielectric being interposed between the first electrode and the substrate, said substrate constituting a second electrode of the capacitive structure; and an insulating layer formed on the surface of the substrate remote from the contoured surface, the insulating layer making contact with the dielectric through said openings in the substrate;

wherein the openings at the bottom of the wells are obturated by the dielectric whereby the dielectric defines blind holes within the wells and the first electrode is in said blind holes.

In the electronic component according to the invention, the intensity of the electrostatic field which is produced in the dielectric when a potential difference is applied between the first and second electrodes is reduced in the portions of the dielectric that are in contact with the insulating layer. In effect, the insulating layer that makes contact with portions of the dielectric through openings at the base of the contoured surface of the substrate functions as part of the dielectric and so it is as if the thickness of the dielectric is increased locally (at the base of the contoured surface of the substrate) and a significant reduction in the vertical component of the electrostatic field in the dielectric here. This reduction in electric field intensity makes it possible for the capacitive structure in the electronic component to tolerate higher operating voltages and/or to have reduced failures at a given operating voltage. Thus, the electronic component is well-adapted for high-voltage applications.

In certain embodiments of the invention a third electrode of the capacitive structure is provided by forming a conductive layer on the surface of the substrate that is remote from the first electrode. Contacts are provided to the first, second and third electrodes to apply the same electrical potential to the first and third electrodes but a different electric potential to the second electrode. For example, the capacitive structure may form an MIMIM capacitor structure. Because the first and third electrodes oppose one another across the dielectric portions that are at the base of the contoured structure, the intensity of the electrostatic field is further reduced in these portions of the dielectric.

In the latter structure, a recess may be provided in the insulating layer in its surface remote from the dielectric, at a location that overlaps (in plan view) with the location of the adjacent portion of the first electrode. By providing electrically conductive material in the recess, the intensity of the electrostatic field is further reduced in the portions of the dielectric at the base of the contoured surface of the substrate.

Likewise, one or more through-holes may be provided traversing the insulating layer (instead of the above-mentioned recesses) and, by providing electrically conductive material in the through-hole, the intensity of the electrostatic field is yet further reduced in the portions of the dielectric at the base of the contoured surface of the substrate.

In embodiments of the invention that include a third electrode, the thickness of the insulating layer is set with a view to ensuring that sufficient isolation is obtained in the planar area. More particularly, in embodiments including the third electrode the reliability of the insulating layer upon being subjected to an electric field should be at least as good as that of the dielectric. In the case where the insulating layer and the dielectric are made of the same material, this criterion involves setting the thickness of the insulating layer to be the same as or greater than the thickness of the dielectric layer. In the case where the insulating layer and the dielectric are made of different materials, this criterion involves setting the thickness of the insulating layer according to the ratio of the breakdown fields of the two materials.

The dielectric need not be a single layer of material. To the contrary, the dielectric may be constituted by a stack of layers of dielectric material.

The present invention further provides a method of fabricating the above electronic component as recited in appended claim 8.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 3A and 3B illustrate electrostatic field concentration in a known structure, in which:

FIG. 3A is a scanning electron microscopy (SEM) image of a capacitive stack formed over a set of pillars protruding from a substrate, and FIG. 3B is a schematic representation of electrostatic field intensity in the dielectric in the structure represented in FIG. 3B;

FIG. 5 schematically represents a cross-section through an electronic component according to a second embodiment of the invention;

FIG. 6 schematically represents a cross-section through an electronic component according to a third embodiment of the invention;

FIGS. 7A-7F schematically represent the results of simulations showing how electrostatic field intensity in a dielectric varies when an insulating layer is added in contact with portions of the dielectric and as the insulating layer and dielectric are patterned to an increasing degree, in which:

FIG. 7A illustrates a comparative example in which no insulating layer contacts the dielectric, FIG. 7B illustrates the dielectric in contact with an insulating layer, FIG. 7C illustrates the case where the insulating layer is a patterned layer including a recess, FIG. 7D illustrates the case where the insulating layer is a patterned layer including a through-hole, FIG. 7E illustrates the case where the dielectric is a patterned layer including a recess, FIG. 7F illustrates a comparative example where the dielectric is a patterned layer including a through-hole;

FIG. 8 is a flow diagram representing the steps of an example method embodying the invention, for manufacturing an electronic component according to FIG. 6.

DETAILED DESCRIPTION OF EXAMPLE EMBODIMENTS

Embodiments of the present invention discussed below provide an electronic component including a 3D capacitance structure, notably a 3D capacitance structure which is designed to cope with high operating voltages. However, it is to be understood that the invention applies more generally to any 3D structures having 2 conductors separated by a dielectric sunk into a pore/well where one of the conductors is carrying a high voltage compared to the other (i.e., there is a high potential difference between the conductors).

Principles of the present invention will become clear from the following description of certain example embodiments. The example embodiments relate to electronic components in which the 3D capacitance structure is formed in wells (holes, trenches) in a substrate. The invention applies irrespective of the shape of the wells/trenches: thus, for example, the invention may be applied in the case of cylindrical wells or pores, elongated trenches, linear or meandering trenches, and so on.

Figure 1:
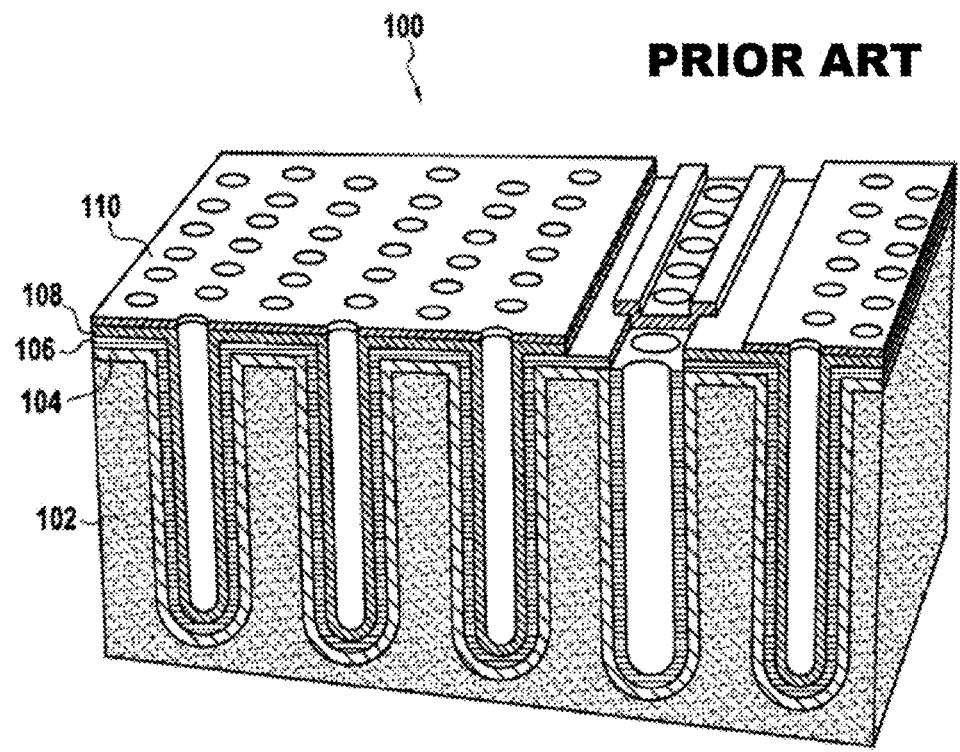
FIG. 1 is a schematic representation of a 3D capacitive structure known in the art.
Figure 4:
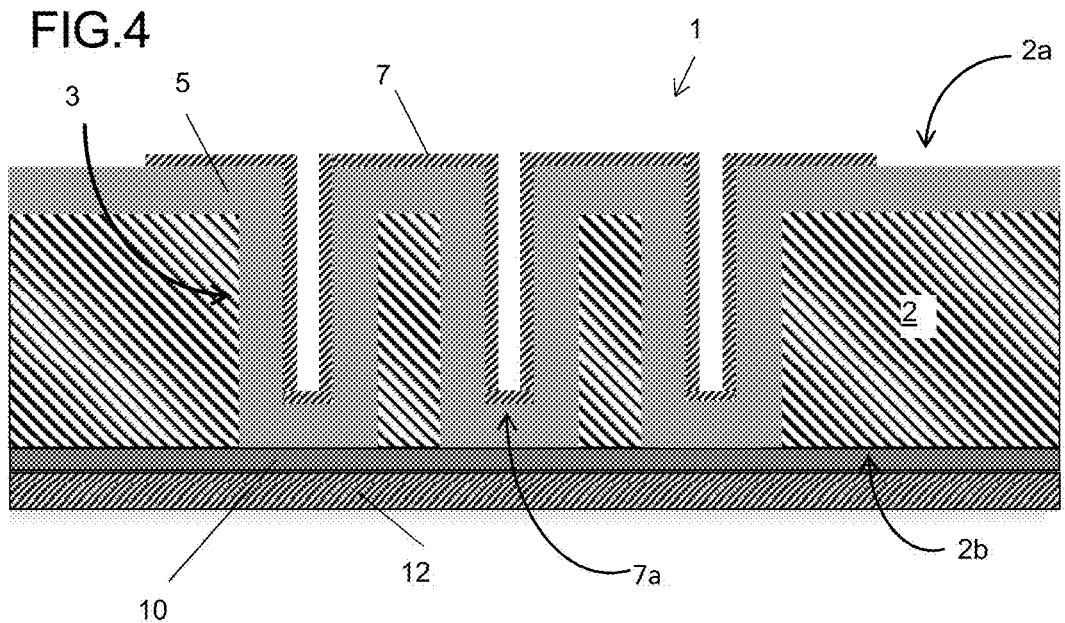
FIG. 4 schematically represents a cross-section through an electronic component according to a first embodiment of the invention.
Figure 2:
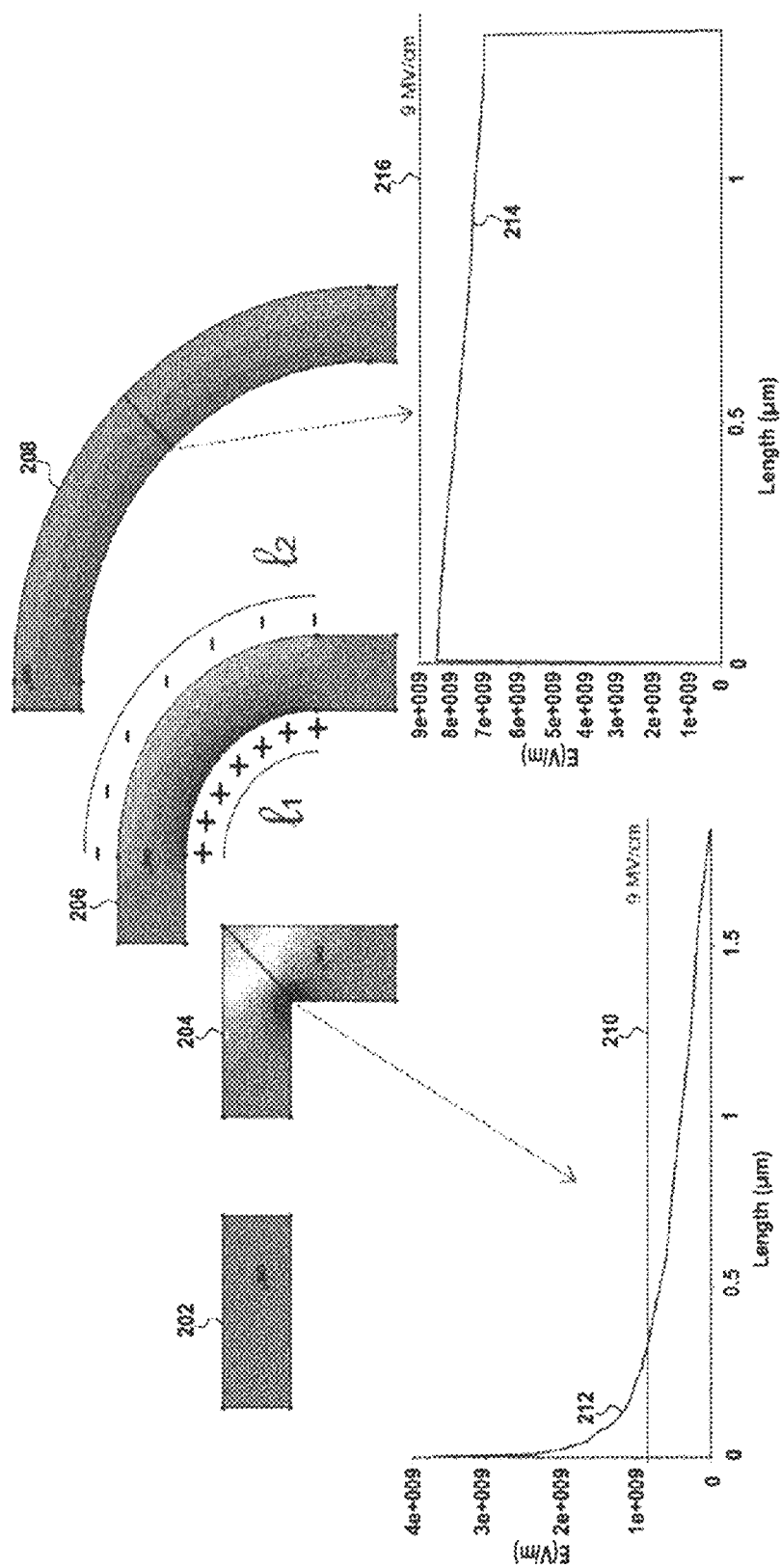
FIG. 2 is a set of diagrams illustrating how electrostatic field concentration varies with the shape of a dielectric layer.

The structure of a first embodiment of electronic component according to the invention is illustrated in a simplified manner in FIG. 4.

The electronic component 1 illustrated in FIG. 4 incorporates a 3D capacitance structure. The component 1 could be a specific capacitance component, or it may incorporate additional active and/or passive components additional to the capacitance structure described below. The description below focuses on the capacitance structure but the skilled person will readily understand from common general knowledge how additional active and/or passive components may be added.

The 3D capacitance structure includes a substrate 2 having a contoured surface 2a and a surface 2b remote from the contoured surface. In this example the contoured surface is formed by a set of wells 3 in the substrate 2. The specific geometry of the wells 3 (e.g., whether their cross-sectional shape is circular, elongated, etc.) is not relevant to the functionality described below and any convenient geometry may be implemented.

A capacitive stack is formed over the contoured surface 2a and follows the shape of the contours. In view of manufacturing constraints, the conformality of the capacitive stack's layers to the shape of the underlying contours may not be perfect, but the deposition processes aim to create conformal layers. The capacitive stack includes a dielectric 5 formed over, and substantially conforming to the shape of, the underlying contoured surface 2a. A conductive layer 7 is formed on the dielectric 5 and serves as a first electrode of the capacitive stack. In the example illustrated in FIG. 4, the dielectric 5 is formed directly on the substrate 2 and the substrate serves as a second electrode. Thus, the dielectric 5 is interposed between the first electrode 7 and the second electrode 2. In use, a potential difference is established between the first and second electrodes.

Figure 3A:
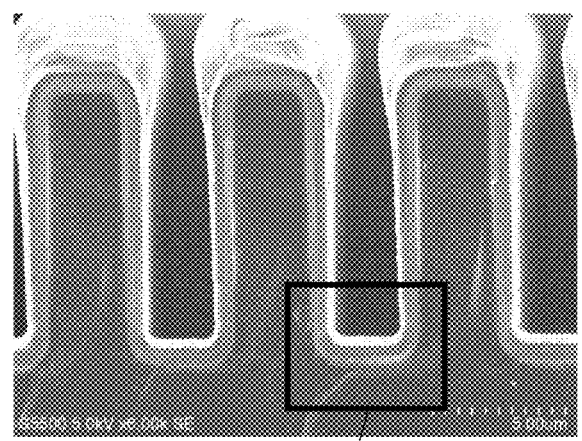
Figure 3B:
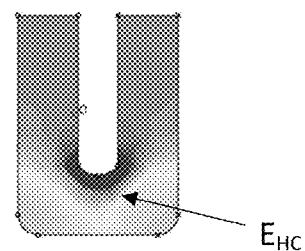

There are openings at the base of the contoured surface 2a of the substrate 2, and portions of the dielectric 5 are exposed at the openings. An insulating layer 10 is formed on the rear surface 2b of the substrate, on a support layer 12. The insulating layer 10 contacts the dielectric 5 through the openings in the substrate. When a potential difference is applied to the first electrode 7 and the substrate/second electrode 2, the portions of the insulating layer 10 that are in contact with portions of the dielectric 5 act as if the thickness of the dielectric 5 was locally increased in the region near the bottoms of the wells in the substrate. Because this locally thick dielectric region has been created, there is no (or very low magnitude) vertical component of the electric field in the dielectric in this region. This means that charges are uniformly concentrated on the vertical walls, with almost no charges on the horizontal wall/tip of the inner electrode. This means that, although the geometry is close to a geometrical singularity, charge build-up around the singularity is prevented and the situation approaches the ideal case of a parallel plate capacitor. As can be seen from FIG. 3B, this region was the location where electrostatic field intensity tended to be a maximum in the previously-proposed structure. Accordingly, it can be understood that the presence of the insulating layer 10 in contact with the dielectric 5 operates to lower electrostatic field in the region where this is most critical.

The substrate 2: might be a conductive material that might be any metal (like Al or Cu) or semiconductor material (like Si) with medium to low resistivity. This could be achieved by surface or bulk doping to dose from E19 to E21 a/cm3. It can also be any insulating material (like alumina or glass or epoxy), coated with a layer of conductive material like metal (Al or Cu) or semi metal like (TiN) or semiconductor (like polysilicon).

The insulating layer 10 and the dielectric 5: may be made of any dielectric, preferably a high dielectric strength mineral dielectric such as silicon dioxide or silicon nitride or alumina, but may, for instance, be any para-electric material. In another implementation, in case the dielectric is very thick (>1.5 μm), the insulating layer may be a high strength polymer such as Parylene or Polyetherimide. It may also be a layered composite layer combining a mineral dielectric and a polymer dielectric, or a layered composite layer comprising plural layers of mineral dielectrics, or a layered composite layer comprising plural layers of polymer dielectrics. In a dielectric made of a plurality of stacked layers, concentration of electric field in any particular layer can be avoided by setting the layer thicknesses dependent on the relative permittivity values (dielectric constants) $\varepsilon_r$ of the materials in the layers. The skilled person will readily understand that, in such a case, the thickness of each layer is set in inverse proportion to its relative permittivity value (dielectric constant) $\varepsilon_r$.

The conductive layers 7, 12: may be formed of any metal (e.g., Al) or semi metal (e.g., TiN) or a semiconductor (e.g., polysilicon). In the case of using a semiconductor, preferably the semiconductor is highly doped and even more preferably degenerated.

The structure of a second embodiment of electronic component 11 according to the invention is illustrated in a simplified manner in FIG. 5. Elements that are the same or similar to those of the first embodiment are indicated using the same reference numerals. To avoid repetition, only the elements that are different from the first embodiment will be described below.

In the electronic component 11 according to the second embodiment of the invention, the support layer 12 is a conductive layer that serves as a third electrode of the capacitive structure. A common potential Vs may be applied to the first and third electrodes (conductive layers 7 and 12) whereas a different potential $V_{DD}$ is applied to the substrate/second electrode 2. As an example, the common potential Vs may be ground.

In the second embodiment of the invention, in the region near the bottoms of the wells in the substrate where electrostatic field is usually concentrated, the first and third electrodes 7, 12 face each other and the dielectric is sandwiched between them. Because the first and third electrodes 7, 12 are at the same potential, there is a further reduction in the electrostatic field intensity in the dielectric in this region. More specifically, in effect the backside voltage biasing to the same potential as the top electrode zeroes the vertical component of the electrical field.

The structure of an example of a third embodiment of electronic component 21 according to the invention is illustrated in a simplified manner in FIG. 6. Once again, elements that are the same or similar to those of the first or second embodiment are indicated using the same reference numerals and only the elements that are different from the first and second embodiments will be described below.

In the electronic component 21 according to the third embodiment of the invention, again the support layer 12 provided under the insulating layer 10 is a conductive layer that serves as a third electrode, the common potential Vs is applied to the first and third electrodes and a different potential $V_{DD}$ is applied to the substrate/second electrode 2. In addition, according to the third embodiment of the invention a recess or through-hole is provided in the insulating layer 10, and conductive material is provided in this recess or hole. It is convenient to use the same material to form the conductive layer 12 and the conductive material present in the recess or hole in the insulating layer 10, so that the overall number of manufacturing steps may be reduced.

In the example illustrated in FIG. 6, in respect of the central one of the three wells illustrated in the drawing, a through-hole 10b is formed through the insulating layer 10, in the thickness direction thereof. This through-hole 10b underlies the region where the conductive layer/first electrode 7 is located at the bottom of the respective well. In this example, conductive material fills the through-hole 10b and, in effect, reduces the distance between the first electrode 7 and the third electrode 12. Accordingly, the electrostatic field intensity in the dielectric 5 at the bottom of this well is further reduced.

Although the example illustrated in FIG. 6 shows a through-hole 10b passing all the way through the thickness of the insulating layer 10, it may be sufficient to form a recess 10a which passes part of the way through the thickness of the insulating layer 10.

In the example illustrated in FIG. 6, in respect of the right-hand one of the three wells illustrated in the drawing, not only is a through-hole 10b formed through the insulating layer 10 but also a recess 5a is formed in the dielectric in the thickness direction thereof. In this example the recess 5a is substantially aligned with the through-hole 10b through the insulating layer 10. In this example, a continuous pillar of conductive material 12d fills the through-hole 10b and the recess 5a.

The effect on electrostatic field intensity that is achieved by virtue of patterning the insulating layer 10, and optionally the dielectric 5, to include a recess or through-hole, and filling the recess or through-hole with conductive material, is illustrated by FIGS. 7A-7F. FIGS. 7A-7F are schematic views which represent the results of simulations which modelled the electrostatic field intensity arising in various structures upon application of a potential difference to the first and third electrodes of a 3D capacitive structure of the general type illustrated in FIG. 6.

Figure 7A:
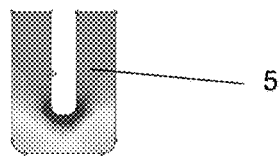

FIG. 7A illustrates a comparative example in which no insulating layer 10 is provided. As in the example illustrated in FIG. 3B, there is a high electrostatic field concentrated in that part of the dielectric which is situated towards the inside of the bend in the dielectric.

Figure 7B:
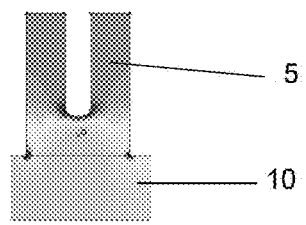

FIG. 7B illustrates electrostatic field intensity in the case where are insulating layer 10 is provided as in the first-third embodiments of the invention. It can be seen from FIG. 7B that the dark grey region which represents highest electrostatic field intensity has reduced in size.

Figure 7C:
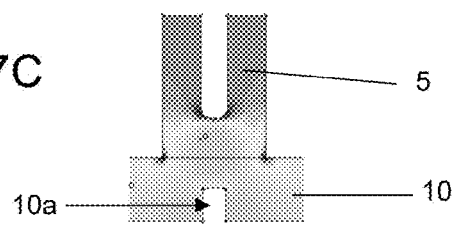

FIG. 7C illustrates the case where the insulating layer 10 is patterned to include a recess 10a extending from the surface of the insulating layer that is remote from the dielectric 5, towards the inside of the insulating layer 10. The recess 10a is substantially aligned with the central curved portion of the dielectric. Conductive material (not shown) fills the recess. It can be seen from FIG. 7C that the dark grey region which represents highest electrostatic field intensity still has a sustained reduction in size compared to the comparative example. Also, electrostatic field intensity is somewhat reduced in the left-hand and right-hand "legs" of the dielectric.

Figure 7D:
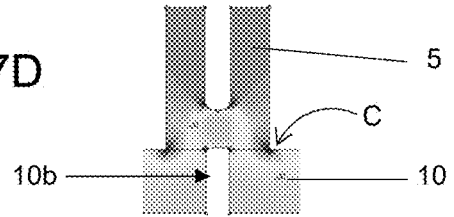

FIG. 7D illustrates the case where the insulating layer 10 is patterned to include a through-hole 10b. The through-hole 10b is substantially aligned with the central curved portion of the dielectric. Conductive material (not shown) fills the through-hole 10b. It can be seen from FIG. 7D that the dark grey region which represents highest electrostatic field intensity is yet further reduced in size. However, at corner regions C where the outermost parts of the dielectric 5 make contact with the insulating layer 10 there are small regions of high electrostatic field.

Figure 7E:
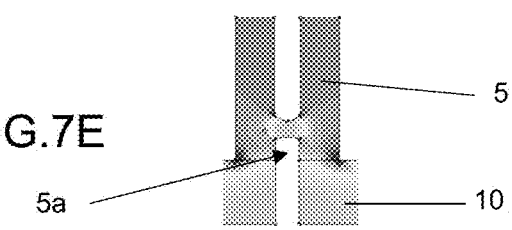

FIG. 7E illustrates the case where the dielectric 5 is patterned to include a recess 5a in the central portion thereof, in the surface facing towards the third electrode 12. Conductive material (not shown) fills the recess 5a. In this case, although there is still a reduction in electrostatic field intensity in the central portion of the dielectric, the high-electrostatic-field regions at the corners C have increased in size.

Figure 7F:
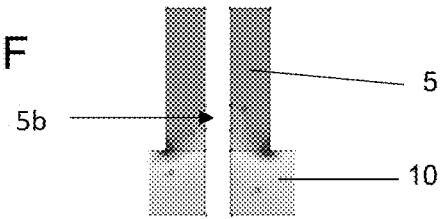

FIG. 7F illustrates a comparative example in which the dielectric 5 is a patterned to include a through-hole 5b in the central portion thereof. Conductive material (not shown) fills the through-hole 5b. In this case, although the electrostatic field intensity in the dielectric has considerably reduced, the high-electrostatic-field regions at the corners C have further increased in size.

In the structure illustrated in FIG. 7C, the geometry of the recess 10a follows the front side trench's geometrical shape. Thus, in the case where the wells in the substrate are cylindrical pores, the recess 10a is cylindrical, in the case of a meander-shaped trench, the recess 10a has the shape of a meander trench (delimited by continuous conductive vertical walls), and so on. The remarks of this paragraph also apply to the through-hole 10b in the configuration illustrated in FIG. 7D, to the through-hole 10b+ recess 5a in the configuration illustrated in 7E.

It should also be noted that the width/diameter of the recess 10a should be set such as to leave a side thickness of dielectric that matches or exceeds the thickness of the dielectric sunk in the 3D well. This is particularly important for the configuration illustrated in FIG. 7E. In other words, the width of the recess 10a should not be larger than the tip of the inner conductor (indicated by label 7a in FIGS. 5 and 6).

It will be noted that, in the structures illustrated in FIG. 6 and FIGS. 7B-7E, the openings at the bottom of the wells 3 are obturated (occluded) by the dielectric 5, i.e., the dielectric layer is continuous across the openings. In other words, the dielectric 5 defines blind holes within the wells and the first electrode 7 is inside these blind holes. Thus, the first electrode layer 7 is prevented, by the dielectric layer 5, from making electrical contact with conductive layer 12 or with conductive material that may be provided in recesses 5a, 10a, or in through-hole 10b.

In the presently-preferred embodiments of the invention, the insulating layer 10 is patterned and includes a recess 10a or through-hole 10b, with conductive material being provided in the recess or through-hole, but the dielectric 5 is not patterned to include recess 5a. It can be understood that such presently-preferred embodiments of the invention include structures as illustrated in FIGS. 7C and 7D. On the other hand, considering ease of manufacture, the embodiments of FIGS. 7B, 7D and 7E are preferred.

An example method of manufacturing an electronic component 41 based on the third embodiment shall now be described with reference to FIG. 8 and FIGS. 9A-9G. FIG. 8 is a flow diagram showing processes included in the manufacturing method. FIGS. 9A-9G illustrate the component structure at various stages during the manufacturing process. In the example illustrated in FIG. 8 and FIGS. 9A-9G, the finished electronic component 41 has an insulating layer 10 patterned to include through-holes 10b in a plurality of the wells in the substrate 2 as in the example illustrated in FIG. 7D.

In the example method illustrated by FIG. 8, a silicon on insulator (SOI) wafer is used as the starting element.

Figure 9A:
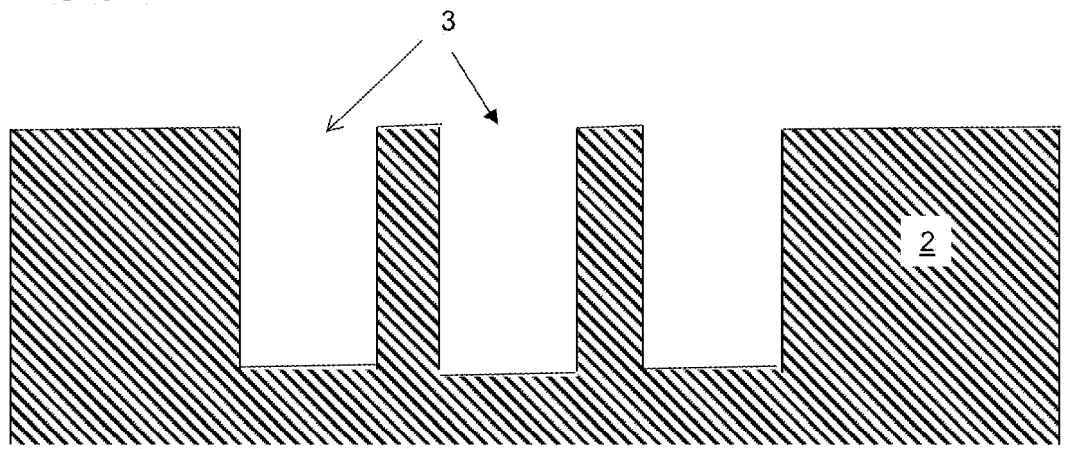
FIGS. 9A-9G illustrate the electronic component at various stages in the manufacturing method of FIG. 8.

In the example method illustrated by FIG. 8, a silicon on insulator (SOI) wafer is used as the starting element and the method begins with front-side processing. In step S801, wells 3 are formed in the substrate 2, as illustrated in FIG. 9A. This step may be performed in any convenient process, for example, by etching. In certain embodiments an etching process is performed to stop on buried oxide (BOX) of the SOI wafer, or etching is performed to a depth determined by etching time.

Figure 9B:
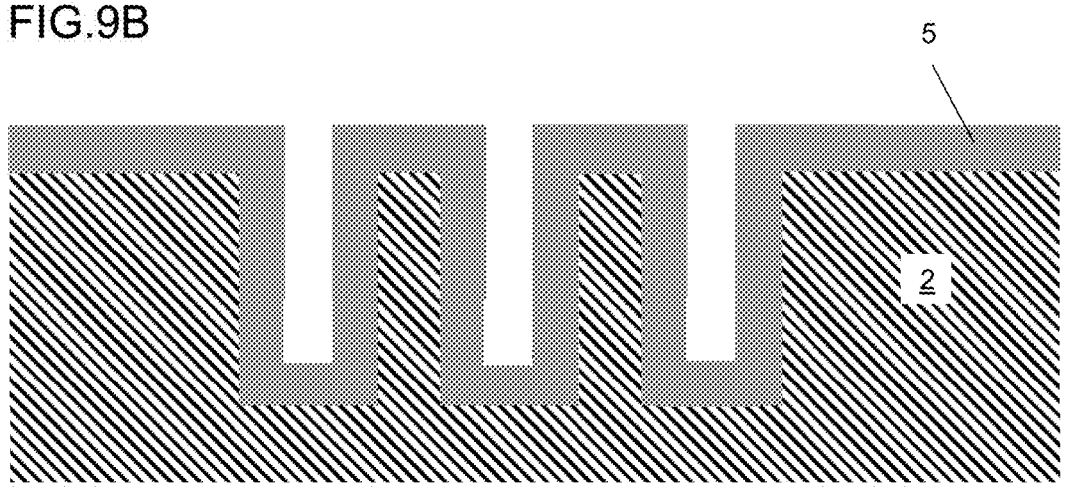
Figure 9C:
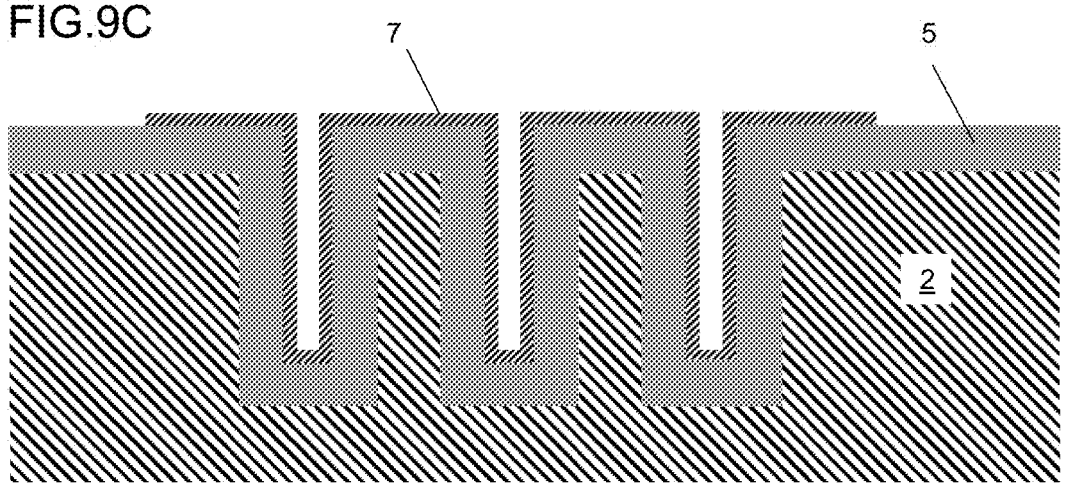

Next, the dielectric layer 5 is deposited on the walls and bottom of the wells (S802), as illustrated in FIG. 9B. Then, conductive layer 5 is deposited over the dielectric 5 (S803), as illustrated in FIG. 9C. The deposition of the dielectric layer 5 and conductive layer 7 may be performed by well-known processes, such as using LPCVD processes, or a combination of LPCVD for the dielectric and an ALD process for the first electrode. The main advantages of those processes are their compatibility with deposition of layers within structures having a large aspect ratio. In the case where polymer dielectrics are used as part of the MIM dielectric, convenient processes for depositing the dielectric layer include CVD, or electrophoretic deposition. The advantage of using the latter processes is that they produce a dielectric layer having a high degree of conformity to the underlying contours.

Figure 9D:
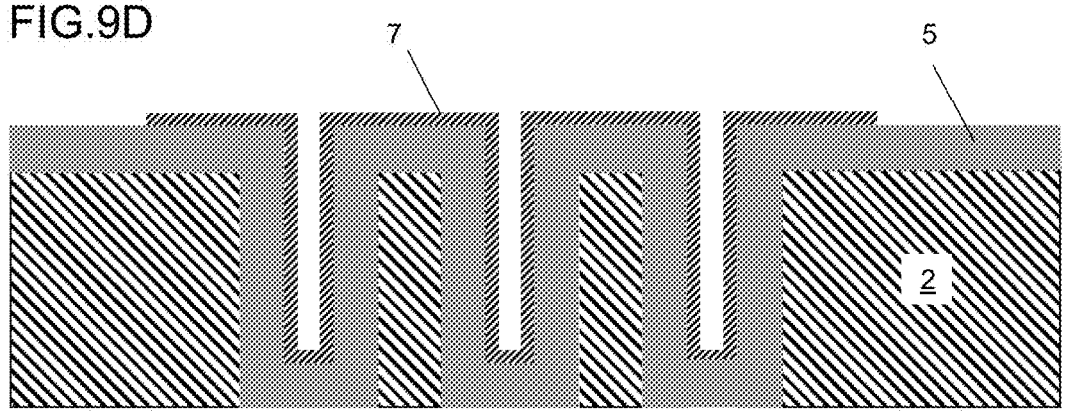

Next, the backside of the wafer is processed. The thickness of the substrate is reduced (S804), as illustrated in FIG. 9D. This may involve thinning of the substrate 2 down to the BOX of the SOI wafer or, if there is a large amount of substrate to remove, grinding of the backside may be performed followed by selectively etched until the tip of the 3D structures is reached.

Grinding processes are well-known in the art and will not be described in detail here except for the following particulars. Typically, for the case of an Si substrate, the grinding process approaches the BOX/the tip of the 3D structures at a distance of 10-15 μm. The final landing on the BOX/Tip of the 3D structures is operated by a wet etching step, typically in a KOH bath. The selectivity to oxides such as $SiO_2$ or $Al_2O_3$ is high and the etching stops by itself onto those layers.

A benefit of the two-stage approach is that coarse grinding is a fast and low-cost process established in many semiconductor fabrication plants (fabs). However, this process generates mechanical defects (mainly dislocations) in the silicon that might propagate through a distance of several μm and, potentially, reach the interface to the oxide. Therefore, it is better to stop the mechanical grinding at a sufficient distance (10-15 μm) from the interface, and complete the backside reveal by a wet etching step that does not induce any mechanical stress.

In embodiments where a recess 5a is to be formed in the dielectric layer 5, the dielectric layer can be patterned from the backside to remove the unwanted part of the dielectric layer (S805).

Figure 9E:
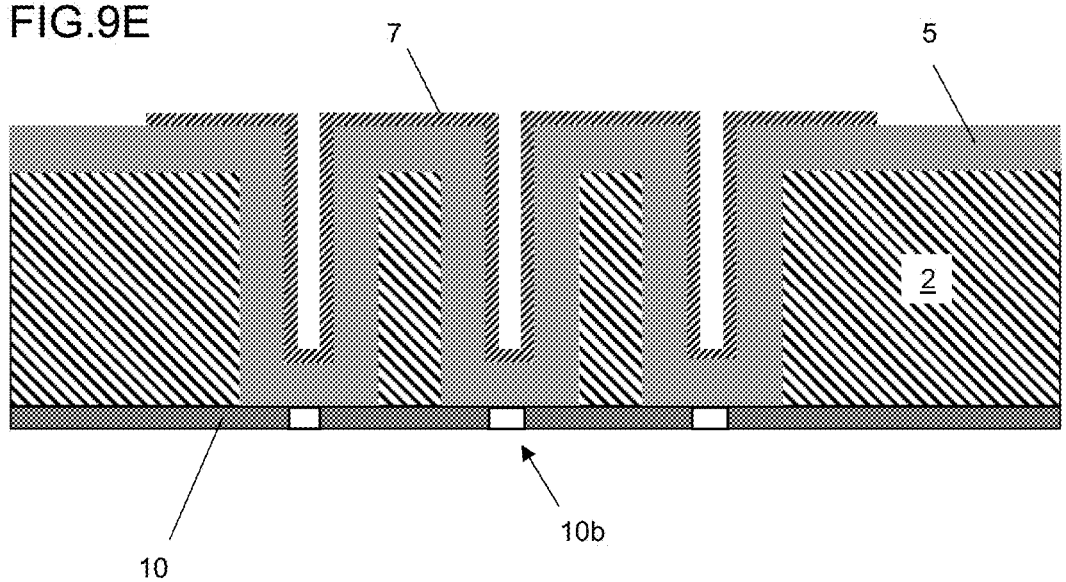

Then the insulating layer 10 is formed (S806) and, if desired, patterned to form, for example, a recess 10a, or a through-hole 10b as illustrated in FIG. 9E. In respect of the backside isolation layer 10, this may be formed as BOX, for example, using direct oxide bonding, preferably at high temperature to enhance adhesion. The advantage of this solution is that the intrinsic quality of the buried oxide will be good, resulting in a high dielectric strength. In that case, the thickness of the insulation layer 10 will be in the order of the thickness of the MIM dielectric.

In the case where the isolation layer 10 is post-processed on the backside, the layer may be formed using PECVD (in the case of an oxide, or a nitride), or CVD, spin coating or dry film lamination (in the case of a polymer). In general, the latter methods are less preferred insofar as dielectric strength of the resulting material is usually poor, making it necessary to increase the layer thickness in order to withstand the electrical field.

In the case where a polymer dielectric is used for the layer 10, good conformity of the deposited layer with the adjacent surface is achieved by using CVD or electrophoretic deposition.

Figure 9F:
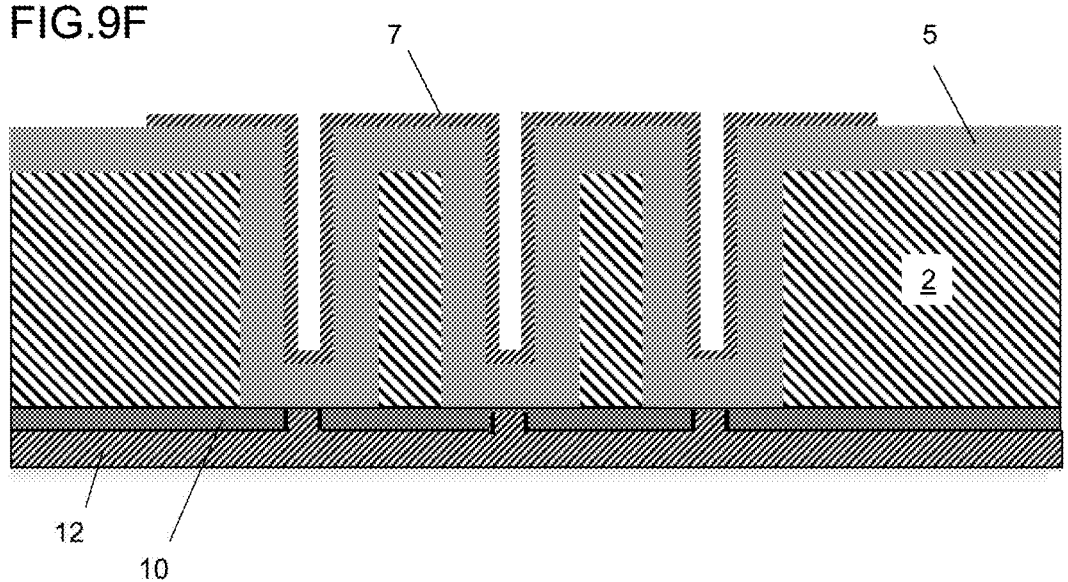

Next, the conductive layer 12 is deposited (S807) as illustrated in FIG. 9F. For the deposition of this planar layer PVD is a preferred process because it is widely available in fabs and has limited costs.

Figure 9G:
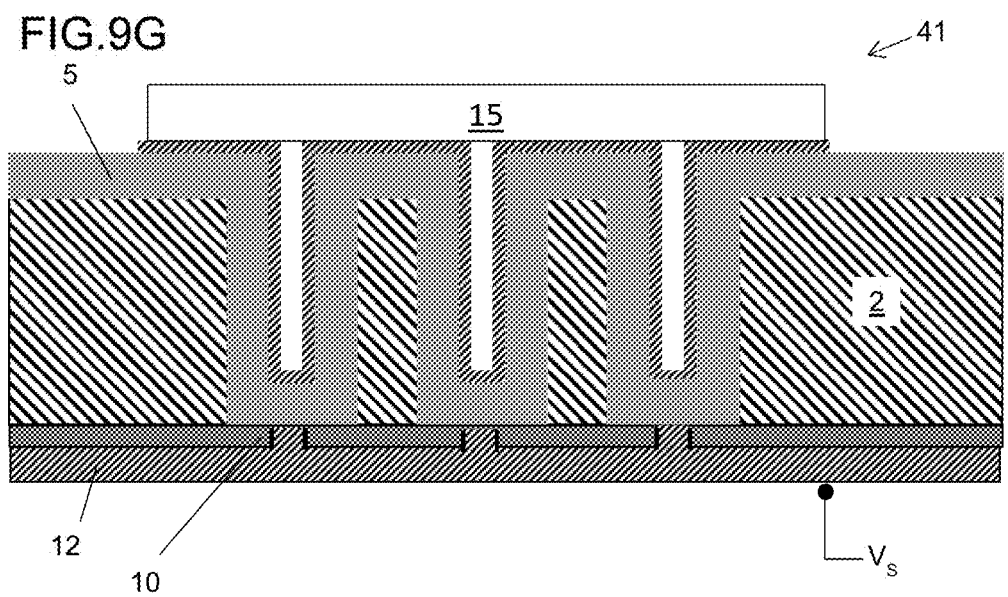

To complete the capacitive structure, in step S808 contacts (not shown) and a dedicated back-end 15 are formed, as illustrated in FIG. 9G, to enable electrical potentials to be applied to the first, second and third electrodes.

The description above relates to one particular example method for manufacturing an electronic component according to the third embodiment of the invention. However, the skilled person will readily understand, from their common general knowledge, how to adapt the described method for manufacture of components according to the first and second embodiments.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. An electronic component comprising a capacitive structure, the component comprising:
    a substrate having a contoured surface comprising a plurality of wells extending into the substrate from the substrate surface;
    a dielectric formed over the contoured surface of the substrate and conforming to the shape of the contoured surface, portions of the dielectric being exposed through openings at the bottom of the wells in the contoured surface of the substrate;
    a first electrode of the capacitive structure, said first electrode being formed over the dielectric and conforming to the shape of the contoured surface, the dielectric being interposed between the first electrode and the substrate, said substrate constituting a second electrode of the capacitive structure; and
    an insulating layer formed on the surface of the substrate remote from the contoured surface, the insulating layer making contact with the dielectric through said openings in the substrate;
    wherein the openings at the bottom of the wells are obturated by the dielectric whereby the dielectric defines blind holes within the wells and the first electrode is in said blind holes.

2. The electronic component of claim 1, comprising a third electrode formed on the surface of the insulating layer remote from the substrate; wherein contacts are provided to the first, second and third electrodes to apply the same electrical potential to the first and third electrodes but a different electric potential to the second electrode.

3. The electronic component of claim 2, wherein the insulating layer (10) is a patterned layer having at least one recess, in the surface thereof remote from the dielectric, at a location overlapping in plan view with the location of a proximal portion of the first electrode, and electrically conductive material is provided in the recess.

4. The electronic component of claim 3, wherein the insulating layer is a patterned layer having at least one through-hole, in the thickness direction thereof, at a location overlapping in plan view with the location of a proximal portion of the first electrode, and electrically conductive material is provided in the through-hole.

5. The electronic component of claim 2, wherein the insulating layer and the dielectric have the same composition, and the thickness of the insulating layer is the same as or greater than the thickness of the dielectric.

6. The electronic component of claim 1, wherein the dielectric comprises a plurality of layers of dielectric materials stacked on one another.

7. The electronic component of claim 6 wherein the respective thicknesses of the stacked layers are in inverse proportion to the relative permittivity of the material in the respective layer, whereby to avoid concentration of electric field in any specific layer of the stack forming the dielectric.

8. A method of manufacturing an electronic component comprising a capacitive structure comprises:

providing a substrate having a contoured surface comprising a plurality of wells extending into the substrate from the substrate surface, the substrate having an insulating layer on a surface thereof remote from the contoured surface;

forming, over said contoured surface, a dielectric conforming to the shape of the contoured surface, portions of the dielectric being exposed through openings at the base of the wells of the contoured surface of the substrate and making contact with the insulating layer through said openings; and forming, over the dielectric, a conductive layer conforming to the shape of the contoured surface, said conductive layer constituting a first electrode of the capacitive structure; wherein the dielectric is interposed between the first electrode and the substrate, said substrate constituting a second electrode of the capacitive structure; and wherein the openings at the bottom of the wells are obturated by the dielectric whereby the dielectric defines blind holes within the wells and the first electrode is in said blind holes.

9. The manufacturing method of claim 8, further comprising:

forming a conductive layer on the surface of the insulating layer remote from the substrate, said conductive layer constituting a third electrode of the capacitive structure;

and forming contacts to the first, second and third electrodes to apply the same electrical potential to the first and third electrodes but a different electric potential to the second electrode.

10. The manufacturing method of claim 9, further comprising:

patterning the insulating layer to form a recess, in the surface thereof remote from the dielectric, or to form a through-hole, at a location overlapping in plan view with the location of a proximal portion of the first electrode; and depositing electrically conductive material in the recess or through-hole.

11. The manufacturing method of claim 8, wherein the insulating layer and the dielectric have the same composition, and the thickness of the insulating layer is the same as or greater than the thickness of the dielectric.

12. The manufacturing method of claim 8, wherein the forming of the dielectric comprises forming a plurality of layers of dielectric materials stacked on one another.

13. The manufacturing method of claim 12, wherein the forming of the plurality of layers of dielectric materials stacked on one another comprises setting the thicknesses of the respective stacked layers in inverse proportion to the relative permittivity of the material constituting the respective layer, whereby to avoid concentration of electric field in any specific layer of the stack forming the dielectric.

* * * * *